United States Patent [19]

Benn, Sr. et al.

[11] Patent Number: 5,141,770

[45] Date of Patent: Aug. 25, 1992

[54] METHOD OF MAKING DUAL ELASTOMER GASKET SHIELD FOR ELECTROMAGNETIC SHIELDING

[75] Inventors: Robert C. Benn, Sr.; Robert C. Benn, Jr., both of Danbury, Conn.

[73] Assignee: Vanguard Products Corporation, Danbury, Conn.

[21] Appl. No.: 597,235

[22] Filed: Oct. 15, 1990

Related U.S. Application Data

[63] Continuation-in-part of Ser. No. 269,350, Nov. 10, 1988, Pat. No. 4,968,854.

[51] Int. Cl.⁵ .............................................. B05D 5/12
[52] U.S. Cl. ...................................... 427/58; 427/380; 427/387; 427/393.5
[58] Field of Search .............. 427/387, 393.5, 58, 427/380; 524/430, 431; 252/511; 174/35 GC

[56] References Cited

U.S. PATENT DOCUMENTS

| | | | |
|---|---|---|---|
| 3,446,906 | 5/1969 | Zulauf | 174/35 |
| 3,576,387 | 4/1971 | Derby | 252/511 |
| 3,609,104 | 9/1971 | Ehrreich | 252/511 |
| 3,783,173 | 1/1974 | Twomey | 174/35 GC |
| 4,011,360 | 3/1977 | Walsh | 428/402 |
| 4,288,081 | 9/1981 | Sado | 277/1 |
| 4,399,317 | 8/1983 | Van Dyk, Jr. | 174/35 GC |
| 4,659,869 | 4/1987 | Busby | 174/35 GC |
| 4,777,205 | 10/1988 | La Scola et al. | 252/511 |
| 4,836,955 | 6/1989 | Ehrreich | 252/512 |
| 4,864,076 | 9/1989 | Stickney | 174/35 GC |
| 4,960,633 | 10/1990 | Hiza et al. | 428/215 |
| 4,968,854 | 11/1990 | Benn et al. | 174/35 GC |
| 4,977,295 | 12/1990 | Chin et al. | 174/35 GC |

FOREIGN PATENT DOCUMENTS

| | | |
|---|---|---|
| 1116650 | 1/1982 | Canada . |
| 2827676 | 1/1979 | Fed. Rep. of Germany . |
| 1600710 | 10/1981 | United Kingdom . |
| 2222913A | 3/1990 | United Kingdom .......... 174/35 GC |

OTHER PUBLICATIONS

Crosby, E. G. and Nuccio, C., "Conductive Seal for Electromagnetic Shielding in Electrical Enclosure"; IBM Technical Disclosure Bulletin, vol. 20, No. 1, Jun. 1977, pp. 282–283.

*Encyclopedia of Chemical Technology*, Kirk–Othmer, 3rd Edition, vol. 20, pp. 928, 929, 1982.

*Primary Examiner*—Michael Lusignan
*Assistant Examiner*—Cary A. Veith
*Attorney, Agent, or Firm*—Browdy and Neimark

[57] ABSTRACT

A gasket shield for counteracting electromagnetic interference is provided with a thin, elastomeric outer layer encapsulating a thicker, elastomeric inner layer as a flexible gasket, the outer layer constituting a metal-filled-elastomer exhibiting high conductivity and excellent attenuation of electrical energy. The thin outer layer is deposited by coating from solution such as by slot-head coating, dip-coating, gravure roll coating, spray coating or knife coating. In this way a thinner and more uniform outer layer can be provided than is achievable by co-extrusion, thereby providing a greater consistency and reduced costs, as well as a greater degree of metal-filling per unit volume of rubber matrix.

13 Claims, No Drawings

METHOD OF MAKING DUAL ELASTOMER GASKET SHIELD FOR ELECTROMAGNETIC SHIELDING

This is a CIP of parent co-pending application Ser. No. 07/269,350, filed Nov. 10, 1988, now U.S. Pat. No. 4,968,854 the contents of which are hereby incorporated by reference.

FIELD OF THE INVENTION

The present invention relates to electromagnetic shielding and, more particularly, to a method of making gaskets such as for cabinet enclosures adapted to receive electronic equipment, the gaskets serving to shield the electronic equipment from damage due to exterior electromagnetic radiation.

BACKGROUND OF THE INVENTION

The problems extant in the prior art are outlined in the background portion of parent application Ser. No. 07/269,350, now U.S. Pat. No. 4,968,854 and are hereby repeated by reference.

PARENT APPLICATION

Said parent U.S. Pat. No. 4,968,854 provides an improved dual elastomer gasket shield for electronic equipment by the provision of an elastomeric gasket formed in two layers, preferably by dual extrusion, in the form of a support layer having high strength, and a relatively thin coating layer having excellent ability to counteract or attenuate electromagnetic radiation. As disclosed in the description of the dual extrusion embodiment of such parent patent the two layers are simultaneously bonded together under the pressure of co-extrusion so that the unity of the resultant gasket is assured and electrical and physical results are optimum.

While co-extrusion provides an excellent product, the thinness of the outer layer achievable by co-extrusion is limited. Because it is the outer layer which is most expensive due to its having incorporated a metal or metal-coated filler, typically a noble metal such as silver coated copper, it would be desirable to provide a thinner outer layer which would reduce the costs of the gasket.

SUMMARY OF THE INVENTION

It is an object of the present invention to overcome deficiencies in prior methods, such as indicated above.

It is another object of the present invention to provide for an improved gasket shielding material.

It is yet another object of the present invention to provide for dual elastomer gasket shielding for counteracting electromagnetic interference.

It is a further object of the present invention to provide an improved process for making such gasket shielding material.

These and other objects are achieved according to the present invention by forming the outer layer by coating rather than co-extrusion, thereby obtaining a high quality outer layer which has a number of advantages, e.g. it can be made thinner than that which is achieved by co-extrusion, higher concentrations of metal filler can be used to obtain better shielding per unit thickness, and more uniform outer layers can be formed.

The above and other objects and the nature and advantages of the present invention will be more apparent from the following detailed description of certain specific embodiments thereof.

DETAILED DESCRIPTION OF EMBODIMENTS

Gasket shields for counteracting electromagnetic interference, as described in parent U.S. Pat. No. 4,968,854, having a thick inner layer and a thin outer layer, are made according to the present invention by first forming the inner layer such as by extrusion. The thin outer layer, a metal-filled elastomer exhibiting high conductivity and excellent attenuation of electrical energy as disclosed in parent U.S. Pat. No. 4,968,854, is then deposited by coating, preferably from dispersion or solution, in any of a variety of ways. Thus, the metal-filled elastomeric outer layer, diluted by a diluent or solvent, may be slot-head coated, dip-coated, gravure roll coated, spray-coated or knife-coated onto the high-strength elastomeric inner layer or extruded profile either immediately after its formation, i.e. before curing, or some time later, e.g. after curing.

The coating composition constitutes a dispersion of metal particles, elastomer and curing agent, in a diluent preferably 30-85% based on the total coating composition, such diluent preferably being an organic solvent such as toluene, xylene, benzene, ketone, chlorinated hydrocarbon, or admixture thereof. A rubber latex can alternatively be used. The dispersion, having a solids content of 15-70%, preferably 25-40% and most preferably about 30%, has a substantially lower viscosity than solvent-free rubber matrix and can be dispensed, such as when using a slot-head coater, by means of a conventional fluid pump.

Immediately after coating, the solvent or diluent is evaporated by drying in hot air at a temperature lower than the solvent or diluent boiling point, followed by application of greater heat to effect curing, e.g. vulcanization. Coating thicknesses are controlled via metering and/or diluent concentration.

The thick elastomeric inner layer corresponds with that disclosed in parent U.S. Pat. No. 4,968,854. The compositions of the inner and outer layers do not form a part of the present invention and may be identical or substantially identical to those disclosed in parent U.S. Pat. No. 4,968,854. On the other hand, a main difference between the present invention and the examples delineated in the parent patent is the application of the outer layer by a coating process including a solvent or diluent which significantly reduces the viscosity of the coating composition, and this has an effect on the resultant product.

As indicated in parent U.S. Pat. No. 4,968,854, the inner layer is substantially thicker than the other coating, preferably on the order of 5-20 times as thick when the inner layer is hollow as preferred. When the inner layer is 5-160 mils thick, preferably 20-80 mils thick, the outer coating is desirably 2-8 mils thick and the preferred thickness ratio of the thick inner layer to the thin outer coating is 10:1.

An advantage of the present invention is that the metal-filled outer layer may be made thinner than that achievable by co-extrusion. Thus, the metal-filled outer layer produced according to the method of the present invention has a thickness of 0.2 to 8 mils, preferably 0.4 to 3 mils and most preferably 0.5 to 2 mils.

Another advantage is that higher concentrations of metal can be used compared with co-extrusion so as to obtain better electrical properties for coatings of equal thickness, or equal electrical properties using relatively thinner coatings. Thus, whereas the typical metal:rubber ratio in the coextruded outer layer is 3:1, the ratio in the coating composition and thus in the coated outer layer can be as great as 10:1, the preferred range being 3:1 to 6:1. Preferred ranges of coating composition solids are 10–60% metal particles and 2–15% rubber binder.

A still further advantage of coating the thin outer layer onto the thick substrate is the achievement of a more uniform, thinner layer than that which is achievable by co-extrusion; minimization of the thickness of the outer layer greatly reduces costs because the most expensive ingredient is the noble metal filler, e.g. silver plated copper or nickel, silver or nickel particles, whereas achievement of a uniform coating provides consistent electromagnetic shielding properties along the entire length of the gasket. Thus, the standard deviation in outer layer thickness uniformity for coextruded product is $1.0 \times 10^{-3}$, whereas coated outer layer uniformity has a standard deviation of only $0.6 \times 10^{-3}$.

The following examples are offered illustratively:

EXAMPLE 1

An inner core is formed by extrusion as disclosed in the example of parent U.S. Pat. No. 4,968,854. A composition as disclosed in Table 1 below is slot-head coated onto the pre-formed inner layer to provide a wet-coating thickness of 5 mils, is then passed immediately to a drying oven to evaporate the toluene solvent and then is passed to a curing oven to effect vulcanization of the coating. The final dry thickness of the outer layer is uniformly approximately 2 mils and the product has good electromagnetic shielding properties.

Table 1

60% Toluene
6% Silicone reinforced gum, e.g. Dow-Corning—Silastic reinforced gum (reinforced with fumed silica)
31% Silver plated copper powder (or flake)
2.5% Crystalline benzoyl peroxide curing agent
0.5% Silane bonding agent

EXAMPLE 2

Example 1 is repeated using a coating composition of 24% silver plated nickel powder and 5% rubber binder, as well as 68% by weight of diluent.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

What is claimed is:

1. A method of making a gasket shield for counteracting electromagnetic interference and comprising a flexible gasket element having a relatively thick elastomeric inner layer of thickness of at least 20 mils and good elasticity and strength and a thin outer layer up to about 8 mils thickness integral therewith, said outer layer being formed of metal-filled elastomer and providing a high degree of attenuation of electrical energy, the thickness ratio of said thick inner layer to said thin outer layer being at least 10:1, said method comprising:

providing said relatively thick elastomeric inner layer;

forming a low-viscosity coating dispersion comprising an amount sufficient of an elastomer binder to form a coherent and self-supporting matrix, a metallic material in particulate form in an amount sufficient to counteract electromagnetic interference, an amount sufficient of a curing agent for said elastomer binder to effect curing thereof, and a diluent in an amount sufficient to substantially reduce the viscosity of said coating dispersion to permit said dispersion to be coated on said inner layer;

coating said coating dispersion on an outer surface of said inner layer in a thin uniform layer sufficiently thick so that upon removal of said diluent the thickness of said coating will be no greater than about 8 mils;

drying the resultant coating to remove said diluent to form said metal-filled elastomer outer layer of thickness no greater than about 8 mils; and curing said metal-filled elastomer outer layer.

2. A method according to claim 1 wherein said diluent is an organic solvent.

3. A method according to claim 1 wherein said diluent is present in an amount based on the total quantity of said coating composition of 30–85% by weight.

4. A method according to claim 1 wherein said elastomer is silicone rubber.

5. A method according to claim 1 wherein said particulate metallic material is selected from the group consisting of silver plated copper powder, silver powder, silver plated nickel powder and nickel powder.

6. A method according to claim 1 wherein said coating composition further comprises a silane bonding agent.

7. A method according to claim 1 wherein said elastomer is silica reinforced silicone gum.

8. A method according to claim 1 wherein said coating is effected by a coating method selected from the group consisting of slot-coating, dip-coating, gravure roll coating, spray-coating and knife-coating.

9. A method according to claim 1 wherein said inner layer is extruded and solidified prior to said coating.

10. A method according to claim 1 wherein said inner layer comprises extruded rubber and wherein said coating is applied to said extruded rubber inner layer prior to curing of said inner layer, said curing step being effected for a time sufficient to effect curing of both said inner layer and said outer layer.

11. A method according to claim 1 wherein said coating is applied to a wet coating thickness such that, after drying, said outer layer has a maximum thickness of 3 mils.

12. A method according to claim 1 wherein said coating is applied to a wet coating thickness such that, after drying, said outer layer has a thickness of less than 2 mils.

13. A method according to claim 1 wherein the ratio of metal particles to elastomer binder is 4:1 to 10:1.

* * * * *